United States Patent [19]

Tabarelli et al.

[11] Patent Number: 4,619,524
[45] Date of Patent: Oct. 28, 1986

[54] DEVICE FOR THE PROJECTION COPYING OF MASKS

[75] Inventors: Werner Tabarelli, Vaduz; Ernst Löbach, Eschen, both of Liechtenstein

[73] Assignee: Perkin-Elmer Censor Anstalt, Vaduz, Liechtenstein

[21] Appl. No.: 656,876

[22] Filed: Oct. 2, 1984

[30] Foreign Application Priority Data

Jan. 23, 1984 [DE] Fed. Rep. of Germany ....... 3402178

[51] Int. Cl.⁴ .............................................. G03B 27/42
[52] U.S. Cl. ........................................ 355/53; 355/43
[58] Field of Search ............................ 355/43, 53, 71

[56] References Cited

U.S. PATENT DOCUMENTS 4,357,100  11/1982  Mayer et al. ......................... 355/43
4,405,229   9/1983  Mayer .................................. 355/53

Primary Examiner—Monroe H. Hayes
Attorney, Agent, or Firm—Pahl, Lorusso & Loud

[57] ABSTRACT

To adjust a device for the projection copying of masks on a semiconductor substrate, adjustment marks are illuminated with wideband adjustment light in order to eliminate variations in the intensity of the reflected signal in the area of a mark field. The color defect created by the wideband nature of the ajustment light is determined by spectroscopic means and taken into account when making the adjustment.

9 Claims, 16 Drawing Figures

DEVICE FOR THE PROJECTION COPYING OF MASKS

BACKGROUND OF THE INVENTION

The invention pertains to a device for projection-copying of a mask onto a workpiece, in particular a semiconductor substrate for the production of integrated circuits, in which case the pattern of the mask is projected via a projection lens onto a photosensitive layer of the workpiece after in order to align the mask and workpiece relative to one another alignment patterns of the mask and adjustment areas on the workpiece have been projected onto each other by means of an adjustment light with a bandwidth of at least 3 nm through the projection lens.

Projection lenses for the lithographic production of integrated circuits are charcterized by a large picture field with a diameter which typically lies between 10 and 30 mn and a large numerical aperture when there is a great resolution capability which is limited with respect to diffraction. Because of the necessity of projecting different pictures one on top of the other in such a way that they precisely cover one another, the distortion in the entire field must not exceed 0.2 μm and the picture field must be completely level, i.e., any convexity must not exceed 0.3 μm.

At the present state of the art, lenses which meet such stringent requirements can be corrected up to the diffraction limit only for a very narrow wavelength range, which is to be understood as a bandwidth of a few nm.

This narrow correction area is selected in such a way that within it the sensitivity of the photosensitive resist is as high as possible and, on the other hand, an appropriate source of illumination is available. Typical correction ranges are 406 nm±4 nm or 436 nm±4 nm, corresponding to the most intense spectral lines of mercury discharge lamps.

As mentioned above, it is vital for the projection of the pattern of the mask to take place not only with good picture quality, but also with complete precision of positioning. The precision with respect to the lateral coordinates (X, Y, θ) is necessary in this case in order for the successive patterns to be correctly allocated, but in addition it is also necessary to precisely focus an entire picture plane since the depth of focus of the above-described lenses is very slight.

The alignment of the mask and workpiece is preferably carried out through the lens itself, and in this process the adjustment areas for lateral adjustment are defined by marks of the most widely varying structure. Per se, the unaltered reflective surface of the workpiece itself is sufficient for focusing.

Focusing as such does not necessarily require that the workpiece be observed through the lens. For instance, it is a known process to determine the distance between the lens and the workpiece by means of capacitive sensors with the aid of the flow resistance which the annular gap between the lens and the workpiece presents to a discharging gas, or from the eigen-frequency of an air resonance section between the workpiece and the lens. A prerequisite in this case, however, is that there be a very short distance between the lens and the workpiece, but such a short distance is precisely what is avoided through the use of projection illumination procedures, in contrast to the obsolete contact procedures. When optical focusing is carried out without the use of the projection lens, a tightly packed beam of light is obliquely directed onto the center of the field to be illuminated and the point where the reflected light beam strikes is observed; the location of this point is a measure of the location of the illumination field itself. The light used is frequently laser light (a HeNe laser). A disadvantage in this case is the fact that it is impossible to distinguish whether the change in the position of the light point on the receiver is caused by a change in the angle of incidence or the Z position. In practice, it is assumed that the angle of incidence is constant, i.e., that the reflective wafer surface is always vertical to the optical axis. This condition is never rigorously met; sometimes there are even large deviations from the ideal position. When laser light is used, another problem arises due to diffraction effects at the wafer surface (speckle), in particular if the surface has already been structured (higher manufacturing stages).

Since, when adjustment is done through the projection lens, the system-related disadvantages of the above-described procedures do not arise, there is great interest in solving the sub-problems which still exist with this type of adjustment. When adjustment is done through the projection lens, problems arise when the adjustment light is not identical to the illumination light for which the projection lens is corrected. Initially we think here of the case where the wavelength range of the adjustment light lies outside of the range of the spectral sensitivity of the photosensitive resist to avoid having the marks on the workpiece be destroyed by the adjustment process. The differences with respect to focal length and magnification which the lens shows depending on the type of light used can be compensated for by bending the adjustment beam through a pair of mirrors or by lengthening the beam by means of intermediate glasses or by shifting the location of the protector for adjustment. Since tests can readily determine the extent to which the focal length and magnification of the lens differ at the corresponding illumination wavelength and adjustment wavelength, overall the consequences of this difference can be easily handled; with respect to the position where the device is optimally aligned with the adjustment light, prior to illumination being carried out a shift is simply made which takes the differing behavior of the lens in the two cases into account.

Since, with an illumination wavelength which deviates from the adjustment wavelength, the picture defects of the lens can be corrected only when the bandwidth of the adjustment light is relatively small, it is assumed that the adjustment light used should, in principle, be narrowband. The frequenlty-made suggestion that laser light be used for adjustment purposes has not proven out in practice since, due to the coherence of this light, diffraction effects (speckle) occur which distort the measurement results. Generally mercury discharge lamp light, the natural line width of which is approximately 3 nm, is thus used for adjustment.

Surprisingly enough, it has been found that, when the adjustment is carried out with mercury light through the projection lens in the way described in the introduction, a nonsystematic error arises, the cause of which was found to be the fact that the reflection capacity of the workpiece is dependent on the processing stage of the workpiece and, in addition, that this capacity varies on the surface of the workpiece. Not only does the color of the reflected adjustment light deviate slightly from the color of the input adjustment light, but differences in the color of the reflected adjustment light appear from workpiece to workpiece and from mark to mark on the same workpiece. If it is assumed that, in addition to the spectral line itself, the adjacent area of the radiation background in a total width of, for example, 10 nm is also typically passed by the narrowband interference filter in front of the adjustment light sources, it is still amazing that the differences of 1–2 nm which arise overall in the wavelength of the reflected adjustment light still have an effect on the precision of the adjustment. Due to the heavy frequency dependency of the lens used, on the one hand, and the extreme demands imposed on adjustment precision, on the other, however, this is indeed the case.

The invention thus is based on the recognition that it is not sufficient, as was previously the assumption, to take into account the differences which arise, regarding the focal length and magnification of the lens, in the illumination wavelength on the one hand and, on the other, and adjustment wavelength which is assumed to be constant, but rather it is necessary to take into account the effect of the difference in the reflection behavior of the workpieces, which difference cannot be known in advance, and which leads to a change in the spectral composition of the input adjustment light.

SUMMARY OF THE INVENTION

According to the invention spectrometric means are provided in the path of the adjustment light reflected by the workpiece. This allows to determine changes in the mean wavelength of the adjustment light and to avoid errors in focusing and lateral alignment which would occur if such changes would be neglected.

Since the invention makes it possible to make complete allowance for the effect of the frequency dependency of the projection lens, it is now possible to increase the bandwidth of the adjustment light to the full extent allowed by the remaining picture defects of the projection lens. A certain amount of assistance is provided in this regard by the method, described in West German Patent No. 29 00 921, of leaving uncorrected picture defects which convert points into lines running sagitally or meridionally to the optical axis and reducing their effect by appropriately orienting the adjustment marks.

The advantage of using as wide an adjustment light as possible lies in the fact that it makes it possible to eliminate adjustment errors which are caused by the fact that, in the area of an individual mark, interference phenomena give rise to changes in the intensity of the reflected light which lead to misinterpretations of the reflected mark picture. With very narrowband light, such changes in intensity occur even when the surface of the workpiece is almost ideal. Deviations in the resist surface from the ideal level shape and the structure of many adjustment marks enhance this effect even further.

The spectrometric means to be used in accordance with the invention should be a small device and an automatic evaluation of the signals resulting therefrom should be possible. Since the device is exclusively used to determine the shift of the mean value of a narrow frequency band, its construction can be simple.

If a diffraction spectrometer is used to implement the invention nothing more is needed for the evaluation of the corresponding signals than a position sensing diode, which indicates the position of a light spot on its surface. An alternative means for determining how the adjustment light is changed by the workpiece consists of a cut-off filter, which reflects or transmits the different components of the reflected adjustment light to a different degree. As will be shown the shift in the mean value of the wavelength of the adjustment light, which is caused by the reflection on the workpiece, is determined by comparing the changes of intensity produced by the filter only, by the workpiece only and by filter and workpiece together.

The use of filters for the spectral analysis of the reflected adjustment light is particularly advantageous, because only minimal constructive changes of existing devices are necessary if it is desired to move a filter plate into the path of the adjustment light and out of it.

DESCRIPTION OF THE DRAWINGS

Further details of the invention will be illustrated with the aid of the drawings. Here.

Figure 1:
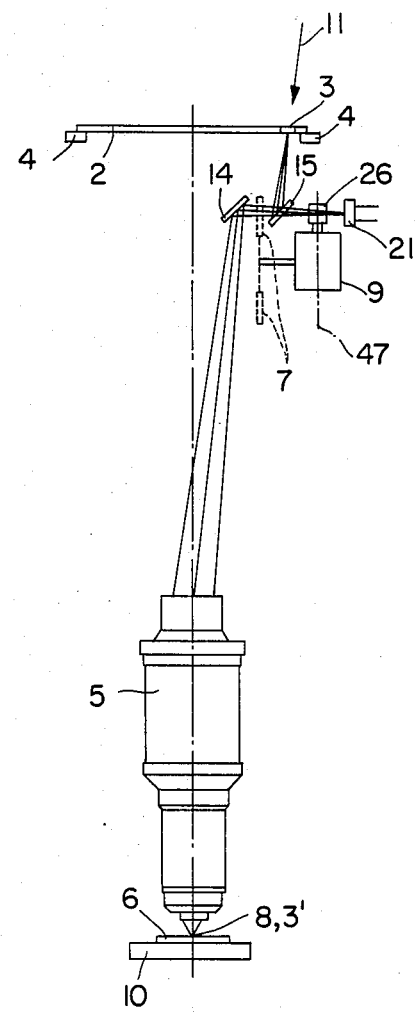
FIG. 1 shows a side view of the known arrangement of the essential elements of a projection copying device for the production of integrated circuits.
Figure 1A:
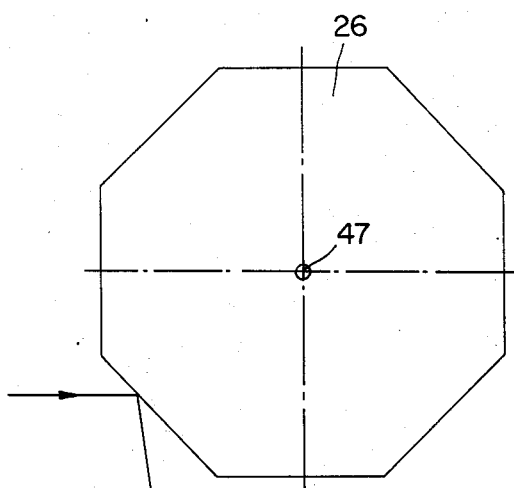
FIG. 1a shows a schematic section from FIG. 1.
Figure 2:
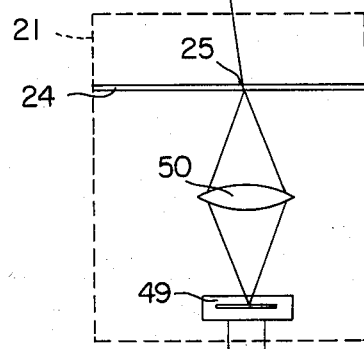
FIG. 2 shows the intensity profile of an alignment mark.
Figure 2:
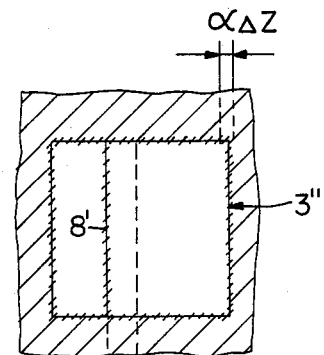
Figure 2:
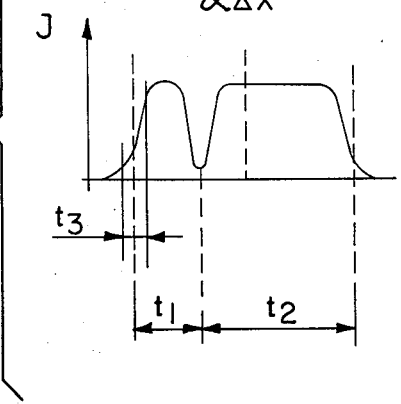

The device shown in FIG. 1 serves to project a pattern consisting of transparent and non-transparent regions of a mask 2, which is mounted on a frame 4. The projection is effected by a projection lens 5, which produces a reduced image of the pattern of the mask 2 on a substrate 6. The device is mainly used for the production of integrated circuits, whereby it is necessary to project different patterns one after the other onto the same substrate 6. It is necessary to align the mask 2 and the substrate which is carried by a coordinate table 10 with extreme accuracy. For the purpose of this alignment a pair of mirrors 14,15 is temporarily brought into the position shown in FIG. 1. Adjustment light 11 is directed on to a window 3 in the mask 2. Typically it has a wavelength 547 or 578 nm and has thus no detrimental effect on the photoresist covering the substrate 6. The adjustment light reaches the substrate 6 via the half-silvered mirror 15, the deviating mirror 14 and the projection lens 5. The substrate carries dark marks 8 in a well reflecting environment. If the window 3 in the mask 2 is projected onto this mask 8 the original 8, 3' of the pattern shown in FIG. 2 is produced on the substrate 6. An image of this original is produced by light rays being reflected by the mirror 14 and penetrating the mirror 15 before being reflected by the rotating mirror 26. This mirror rotates about an axis 47 whereby the image 3" of the image 3' of the window 3 and the image 8' of the mark 8 move over the detection plane 24 of the detecting device 21. A gap 25 in the detecting plane 24 is imaged onto a sensor 49 by a lens 50. The sensor 49 produces an electric signal, which is proportional to the intensity of the light it receives. During the rotation of the mirror 26 the image shown in FIG. 2 moves in X-direction across the gap 25. Correspondingly the signal produced by the sensor 49 increases when the reprojected image of the window 3 falls onto the gap 25 and it decreases after a time $t_1$ when the image of the mark 8 darkens the gap. The ratio $t_1:t_2$ indicates how far the mark 8 is off its ideal position in which this mark is exactly in the center of the image 3' of the window 3 on the substrate 6. As is known from DE-A-No. 29 05 635 this procedure may also be used to judge how well the device is focused: if the image 3' of the edges of the window 3 produced on the substrate 6 is sharp and if its projection onto the detection plane 24 is sharp the electric signal in FIG. 2 reaches its maximum value in a very short time $t_3.t_3$ increases if the window 3 is not sharply reproduced on the substrate 6 and on the detection plane 24. In a similar way the breadth of the negative spike which is caused by the mark 8 is an indicator for the quality of the projection of the mark 8 onto the detector 21.

Figure 3A:
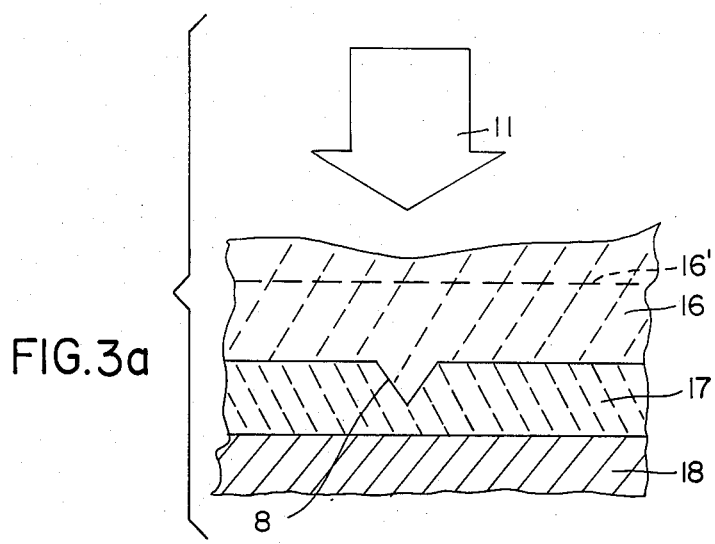
FIG. 3a shows a cross-section through the substrate in the area of an adjustment mark.
Figure 3B:
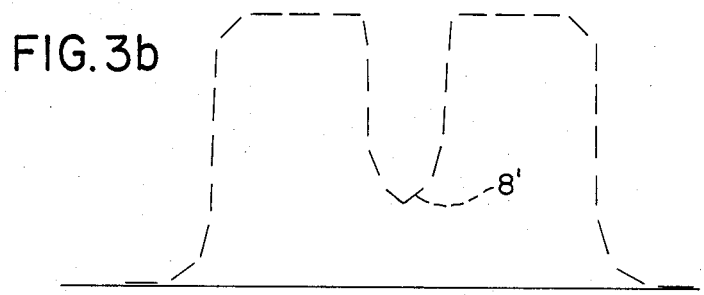
FIG. 3b shows the corresponding adjustment signal in idealized form.
Figure 3C:
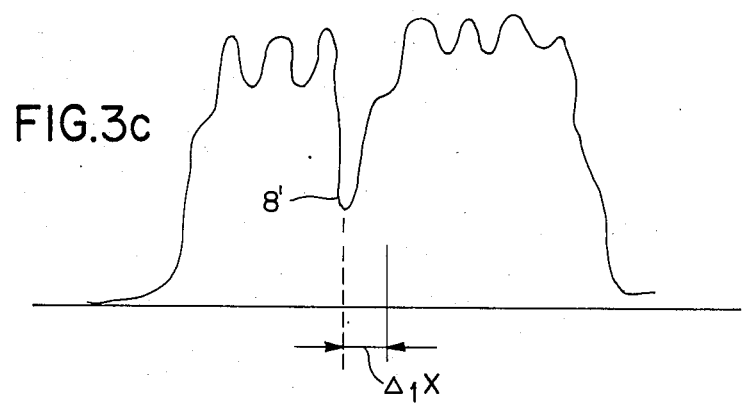
FIG. 3c shows the corresponding adjustment signal with narrowband illumination.
Figure 3D:
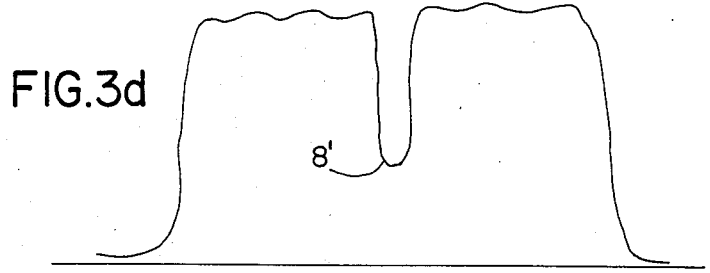
FIG. 3d shows the corresponding adjustment signal with wideband illumination.

In practice it is found that, when an actual substrate, namely a wafer is illuminated in which a process layer 17 is built up on a base 18 and a photosensitive resist 16 is built up on this process layer (compare FIG. 3a), the corresponding signal will frequently not have the ideal form shown in FIG. 3b which would correspond to an ideal surface 16' of the substrate. If adjustment light 11 is more narrowband, for example, when illumination is done with a laser, then, as indicated by FIG. 3c, interferenceinduced intensity variations can occur in the observation area of an adjustment mark 8 which is limited by the edge of window 3. Although adjustment mark 8 is precisely centered, the impression can still arise that it is outside of the correct position by a distance $\Delta_1 X$. If, on the other hand, coordinate table 10 is moved until image 8' of adjustment mark 8 lies in the center of alignment pattern 3, in reality the substrate will also be laterally displaced by the same amount.

As mentioned, it is not possible to make allowance, by calculation, for this error which occassionally occurs due to the intensity variations in the observation area since the reflection capability of the substrate is a function of the wavelength and location on the substrate surface and this function is not known in detail since it assumes individual values for different substrates and different mark shapes. It is possible, however, to eliminate the effect of the wavelength dependency of this function to a large extent by working with relatively wideband adjustment light 11. In this case the preferred adjustment wavelength ranges lie between 480 and 600 nm and 520 and 600 nm. Justification for this lies in the fact that, on the one hand, we wish to be outside of the sensitivity area of the photosensitive resist on the one hand, and on the other, we wish to be as close as possible to it so that the lens defects which are correct for the wavelength of the illumination light will remain as small as possible. A halogen lamp or a xenon high-pressure lamp can be used, for example, to generate the adjustment light.

The invention is based on the observation that even in cases where, from the very outset, an externally correct mark shape as shown in FIG. 3 is present and it is only when this mark shape is forced into being by the use of relatively wideband adjustment light, erratic errors arise in adjustment. The reason for this is, as mentioned, the fact that relatively wideband light is spectrally modulated in accordance with the reflection capability of the wafer, i.e., certain wavelength intervals from the primary adjustment light spectrum are attenuated to a greater extent, and others to a lesser extent. A shift in the center of the waveband occurs, which is important in two regards: first it is possible for adjustment marks 8 of two different wafers to shift the center of the waveband in different ways at the same point, for example, on the optical axis. If the reflected light is at one instant more green and then more yellow, the plane of the optimum focusing will lie at very different levels. The adjustment of the X-Y table at a Z position corresponding to a signal which previously delivered good picture quality in blue illumination light will suddenly lead to poorly focused pictures. Shifting of the color center of the reflected light compared to the input light occurs in particular when the observed adjustment marks are located at different points in the picture field. The reason for this is, on the one hand, the fact that the reflectivity function exhibits a systematic dependency on the distance from the center of the picture and, on the other hand, the fact that there are slight variations in the thickness of process layer 17. The distance from a mark which is away from the axis will be judged differently depending on the color of the reflected light. As in the case of FIG. 3c, this phenomenon, known as color magnification defect, leads to misjudgement of the lateral position of the substrate, although for different reasons.

Figure 4:
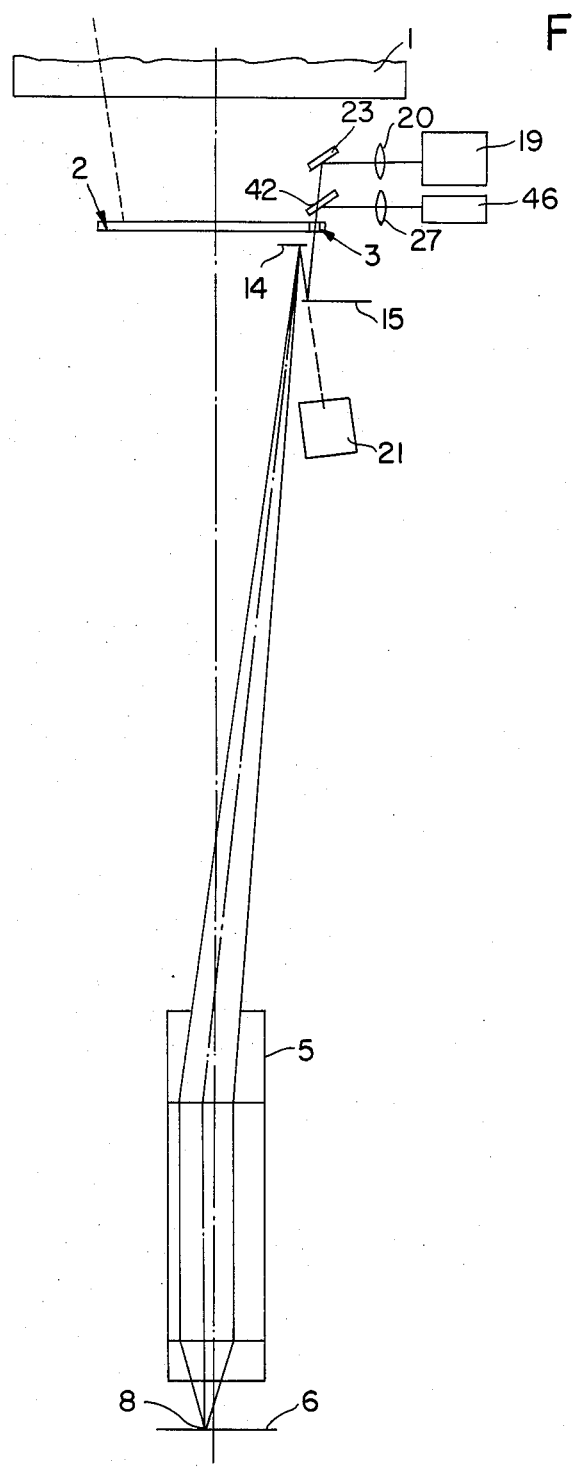
FIG. 4 shows a practical example of the invention in a schematic side view.

As is shown in FIG. 4, only minor changes have to be made if spectrometric means according to the invention are to be incorporated into a device corresponding to the state of the art as is shown in FIG. 1. The adjustment light which is emitted by a light source 19 is projected through the alignment pattern on the mask 2, i.e. the window 3, by a lens system 20 and a mirror 23 and reaches the mark 8 via a pair of mirrors 15,14. The reflected light is analyzed in a detecting device 21 as described above. In addition part of the reflected light reaches a spectrometric device 46 after being reflected by the mirror 15 and the semitransparent mirror and after having passed the lens system 27.

The relative position of the alignment pattern on the mask and the adjustment marks 8, which yields an optimum image quality if the substrate is treated with illumination light, is determined by trial and error. It may result from these experiments that the change of the light path produced by the mirrors 14,15 is not sufficient to eliminate the effect of the different behavior of the projection lens 5 at the illumination wavelength and the adjustment wavelength respectively. This means that after determining the apparent optimal alignment as described with reference to FIGS. 1 to 3 an offset of the substrate is necessary. The invention allows for an improvement of this procedure because by determining the mean wavelength of the reflected adjustment light it is possiblie to take into account that this mean wavelength may have been different during calibration. When producing the control signals for movement of the substrate or the mask the influence of the wavelength of the reflected adjustment light on the set-off mentioned are easily calculated because the wavelength dependency of the projection lens 5 is known. It is known therefore how far the focal plane is shifted if the mean wavelength changes to a degree measured by the spectrometric device.

Figure 5:
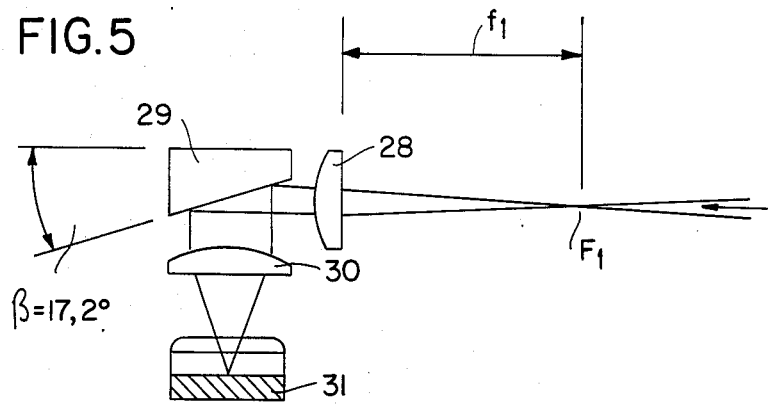
FIG. 5 shows a schematic view of a first embodiment of spectrometric means according to the invention with FIG. 5a detailling the path of the light rays in the vicinity of the diffraction grating and FIG. 5b showing the principle of the position sensing diode which are both part of the device according to FIG. 5.

FIG. 5 shows a particularly simple embodiment of a spectrometric device 26 according to the invention. The light to be analyzed enters the spectrometer from the right side, the focal point $F_1$ being adapted by the lens system 27 in FIG. 4. A lens 28 makes the light rays coming from $F_1$ parallel. The diffraction grating 29, which is an echellette, produces a first order diffraction spectrum of the adjustment light at an angle of about 90°. In closing the inclination of the areas 43 care is taken that the direction of the reflected light coincide with the direction of maximum intensity of the first diffraction spectrum.

Figure 5A:
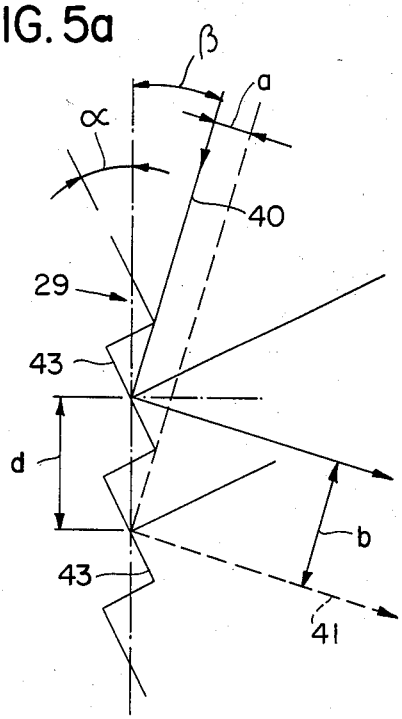

FIG. 5a illustrates the basis for the dimensioning of the grating 29: the light rays 50 and 41 shall be reflected at a right angle for constructive reasons. Their incident angle on the areas 43 of the grating 29 has therefor to be 45°. The paths of these two rays differs by b−a and this difference must be equal to the wavelength of the diffracted light if maximum intensity is to be obtained in the direction of reflection. From this follows the condition $\cos \beta - \sin \beta = \lambda/d$, wherein d is the grating space. From this equation one can calculate the angle $\beta$ under which the grating surface should be inclined relative to the direction of the incident rays and also the angle $\alpha$ and which the areas 43 are inclined, because $\alpha + \beta = 45°$. It would be possible, for instance, to use a grating which is offered by PTR-Optics under the name HR-1200-7500.

Figure 5B:
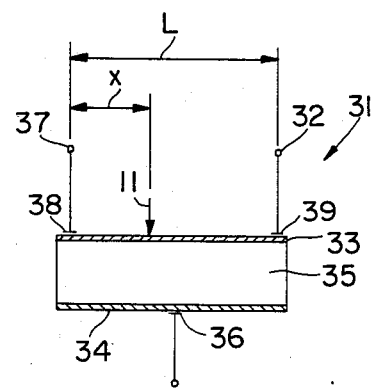

The light diffracted by the grating 29 is projected onto a position sensing semiconductor diode 31 by the lens 30. Such diodes are known and only their function will be described with reference to FIG. 5b. A position sensing diode is essentially a PIN-diode with comparatively large area, the P- and N-zones being thin layers of constant resistivity. Between these layers a photovoltaic current is produced if light incides on the surface of the diode. In FIG. 5b the I-layer 35 is positioned between a P-layer 33 and a N-layer 34; electrodes 38 and 39 with terminals 37 and 32 are positioned along the edges of the P-layer 33, an electrode 36 is positioned opposite the electrodes 38 and 39. If a light spot is produced by the adjustment light 11 at a point x, photovoltaic currents flow through the electrodes 38 and 39 respectively. The ratio of the current intensities as $I_1/I_2 = L/x - 1$. The ratio of the current intensities is thus proportional to the displacement of the incident light spot from the center of the diode. It is advantageous to take care that normally the reflected adjustment light is diffracted into the center of the position sensing diode 31. In this case the ratio of the current intensities $I_1$ and $I_2$ measured at the terminals 37 and 32 indicates immediately changes in the mean value of the adjustment light. These changes can thus be taken into account when the substrate is moved from its nominal alignment position determined according to FIGS. 1 to 3 into its really optimal position.

Figure 6:
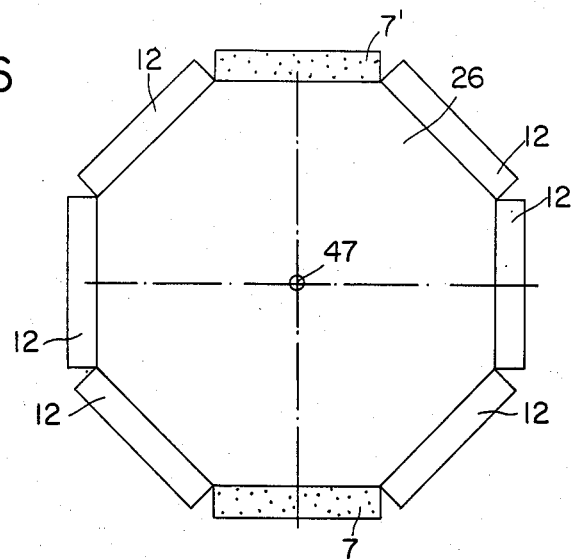
FIG. 6 shows how the rotating mirror of FIG. 1a may be transformed into an embodiment of the invention.
Figure 7:
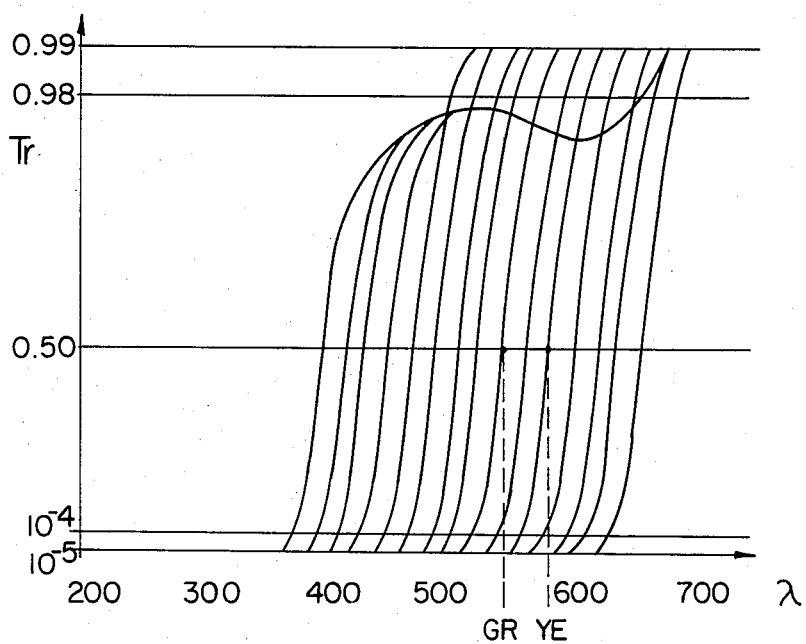
FIG. 7 shows the transmission curves for a series of available cut-off filters.

As has been mentioned above the change in the color of the adjustment light due to the reflection by a workpiece may be determined by temporarily moving a filter into the path of the adjustment light provided the transmittance of the filter is strongly frequence dependent at the wavelength of the adjustment light. Filters of this type are available either as colored glasses or as interference filters. Among the colored glasses some owe their color to ions dissolved therein, others to submicroscopic particles which color the glass only upon tempering. This latter type is particularly suitable for the invention. As is shown in FIG. 7 the transmittance curve of these filters form a kind of edge separating an area with greater wavelength and high transmittance and an area of small wavelength and low transmittance. Each curve in FIG. 7 corresponds to an available filter. If the adjustment light is green, one chooses a glass with 0,50 transmittance at 547 nm, if the adjustment light is yellow, a glass with 0,50 transmittance at 578 nm. The only alteration which has to be made in a device according to FIG. 1 in order to be able to use such filters according to the invention is shown in FIG. 6: the rotating mirror 26 has to be plated with some filters 7 and 7' corresponding to the adjustment wavelengths used. The remaining sides of the prism shaped mirror are to be covered with plates 12 consisting of transparent glass.

Figure 8:
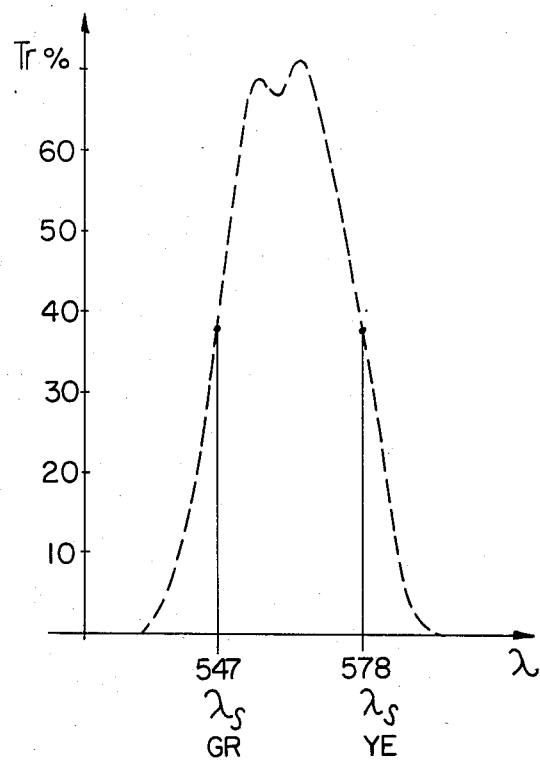
FIG. 8 shows the transmission curve of a dielectric broadband interference filter.

In some cases it may be advantageous to use an interference filter instead of a colored glass. This applies if a single filter shows a strong frequency dependence of its transmittance Tr at two adjustment wavelengths to be used as shownin FIG. 8. Contrary to colored glasses the function of which is based on absorption, interference filters relect the non-transmitted part of the radiation. Consequently such filters cannot be mounted on a rotating mirror 26 as shown in FIG. 6. It is nevertheless very simple to mount such filters in a way which allows to move them into the path of the adjustment light and out of it. How this is done is indicated in dashed lines in FIG. 1, which apart from this feature represents the state of the art: here, the filter 7 is rotatable by means of a drive 9 which may be derived from the drive of the rotating mirror 26.

Filters may be used to determine the color shift produced by a workpiece of unknown reflectivity, because the color shift produced by the filter is known or may be easily determined.

Figure 9:
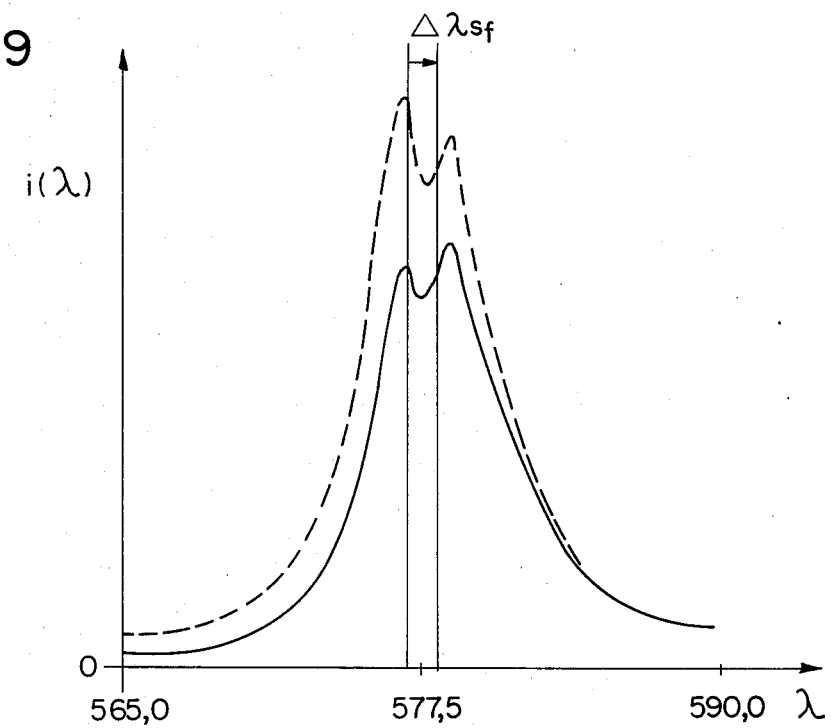
FIG. 9 shows how the mean value of reflected adjustment light is shifted by a cut-off filter.
Figure 10:
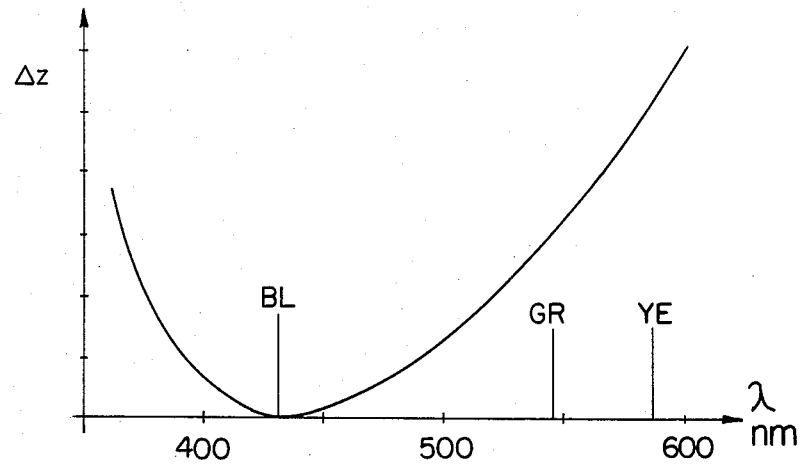
FIG. 10 is a diagram showing how the focal length of the projection lens changes with the wavelength of the transmitted light.

FIG. 9 shows how a cut-off filter changes the color of the adjustment light. In FIG. 9 the dashed line shows the differential intensity $i(\lambda)$ of yellow adjustment light and the uninterrupted line shows the same waveband after filtration. Obviously the filter has caused a color shift in direction of greater wavelength. The mean of the waveband in FIG. 9 has been displaced to the right by the amount $\Delta\lambda_{sf}$. In order to determine this shift no detailed analysis of the curves in FIG. 9 is necessary. $\Delta\lambda_{sf}$ can be determined directly because for any projection lens it is known how large a displacement $\Delta z$ in direction of the optical axis is necessary in order to maintain a sharp image, if the wavelength changes. As can be seen from FIG. 10 for blue light (BL), which is used for copying the mask, the focal length of the lens is not very sensitive to color changes. Obviously the projection lens is designed in such a way that the color defect in longitudinal direction is at its minimum for the illumination wavelength. For green (GR) and yellow (YE) light, however, the focal length of the projection lens 5 depends strongly on the wavelength. If, for instance, the wavelength of the light received by the detecting device is shifted with a shift $\Delta\lambda s_f$, it is necessary to move the workpiece along a distance $\Delta z$, which may be derived from the slope of the curve in FIG. 10 at the adjustment wavelength. Alternatively the known slope of the curve in FIG. 10 may be used to determine $\Delta\lambda s_f$. This is done by focusing an ideally reflecting workpiece which does not cause a color shift and by measuring the displacement of this workpiece in direction of the optical axis, which is necessary to obtain sharp focusing again after a transparent glassin the light path has been replaced by the filter. If the necessary displacement is $\Delta z$, the color shift of the adjustment light produced by the filter follows from $\Delta z = k.\Delta\lambda s_f$, k being the slope of the curve in FIG. 10 at the adjustment wavelength.

It will now be shown that knowledge of the color shift of the adjustment waveband produced by a filter reduces the task of determining the color shift due to a workpiece of unknown reflectivity $R(\mu)$ to simple intensity measurements. For simplicities sake the original signal is assumed to be rectangular and of width a corresponding to the first diagram in FIG. 11. The differential intensity $i(\lambda)$ may be assumed to be 1. Such a rectangle is a good approximation of the original signal shown in FIG. 9 and there is no principal obstacle to perform the calculations with a better approximation of the slope of the curve shown in FIG. 9.

Figure 11:
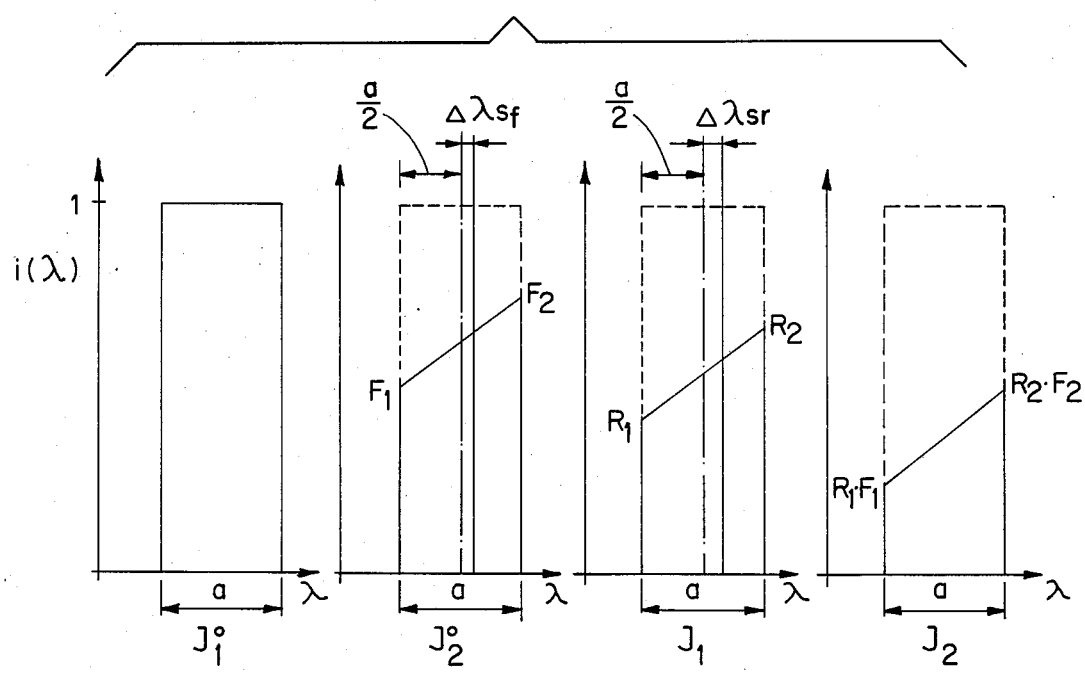
FIG. 11 illustrates the considerations upon which the determination of the color shift of the adjustment light is based.

The total intensity of the signal received by the detecting device 21 may be $J_1^0$, if the adjustment light is reflected by an ideally reflecting substrate. If now a filter is brought into the light path the original rectangle in FIG. 11 is changed as shown by the second diagram in FIG. 11: the total intensity represented by the shaded area is reduced to the value $J_2^0$; the differential intensity $i(\lambda)$ varies from a value $F_1$ corresponding to the shortest wavelength of the adjustment waveband up to a value $F_2$ for the longest wavelength of this band. The linear approximation of the curve from $F_1$ to $F_2$ is well justified by the consideration that the original signal may have a bandwidth of only $a = 30$ nm.

After measuring $J_2^0$ and after determining $\Delta\lambda s_f$ as described above the calculation of $F_1$ und $F_2$ is elementary. These values are constant for a certain type of adjustment light and for a given filter which means that the user of the device may regard them as known.

The user of a device according to the invention may determine the color shift produced by a certain workpiece covered with a layer of photoresist by making two measurements of the total intensity of the signal which is shown in FIG. 2. The first measurement is performed with no filter in the light path. With reference to FIG. 6 this means that a plane of the rotating mirror 26, which is covered by a plate 12 of plain glass, projects the image of the mark 8 onto the detecting device 21. The corresponding intensity $J_1$ is determined. It corresponds to the area below the curve from $R_1$ to $R_2$ in the third diagram of FIG. 11. $R_1$ is the reflexivity of the workpiece at the shortest wavelength of the adjustment light, $R_2$ the reflexivity of the other end of the waveband. It follows that $J_1 = (R_1 + R_2).a/2$. $R_1$ and $R_2$ have to be known in order to determine the color shift $\Delta\lambda s_r$ produced by the workpiece, this shift being represented by the distance between the mean value of $i(\lambda)$ and the central line of the diagram. A second relationship between $R_1$ and $R_2$ is obtained by measuring the total intensity of the signal according to FIG. 2, if a filter 7 (or 7') as well as the workpiece of unknown reflexivity $R(\lambda)$ are passed by the adjustment light. The corresponding differential intensity is represented in the fourth diagram of FIG. 11, from which follows that the differential intensity $i(\lambda)$ is $R_1.F_1$ and $R_2.F_2$ respectively at the edges of the adjustment band. Obviously $J_2 = (R_1F_1 + R_2F_2).a/2$. $R_1$ and $R_2$ may now be used to determine the value $\Delta\lambda s_r$, the color shift produced by any workpiece.

It is a particular advantage of both embodiments of the invention that the determination of the color shift produced by a workpiece is effected during the alignment process, which means that it does not diminish the output of the device. Especially the embodiment according to FIG. 6 requires only minimal constructive changes to obtain the desired effect.

We claim:

1. A projection mask aligner for aligning a mask and a workpiece relative to one another, said aligner comprising:
   a radiation source for projecting patterns formed on a mask onto a radiation sensitive surface of a substrate via a projection lens means;
   at least one window formed in the mask;
   at least one mark formed on the substrate;
   adjustment light means for projecting adjustment light through said window and said projection lens means onto the substrate;
   detector means disposed to receive adjustment light reflected from said substrate via said projection lens means for determining the position of said at least one window relative to a corresponding said at least one mark;
   spectrometric means also disposed in the path of the reflected adjustment light to receive said reflected adjustment light and determine changes in a mean wavelength of the reflected adjustment light;
   whereby color errors introduced by the finite bandwidth of the adjustment light may be determined.

2. Device in accordance with claim 1, wherein said adjustment light has a bandwidth of at least 30 nm.

3. Device according to claim 1, wherein the spectrometric means is a diffraction spectrometer.

4. Device according to claim 3 wherein said diffraction spectrometer includes an echelette for splitting up the light.

5. Device according to claim 3, wherein the diffracted light is analyzed by means of a semiconductor diode providing a signal indicative of the position of the light incident upon said diode.

6. Device according to claim 1, wherein the spectrometric means comprises a filter, the transmittance of which varies strongly across the bandwidth of the adjustment light, and further comprises means for detecting a change of the intensity of the reflected adjustment light caused by said filter.

7. Device according to claim 6, wherein the filter is a coloured glass mounted on at least one side of a prismatic rotating mirror transmitting the images of the alignment patterns of the mask and of the adjustment areas on the workpiece to the means for detecting the change of the intensity.

8. Device according to claim 6, wherein the filter is mounted to be moved in and out of a position in which the reflected adjustment light passes straight through it.

9. Device according to claim 8, wherein the filter is an interference filter the transmittance of which is strongly frequency dependent around 547 nm and around 578 nm.

* * * * *